United States Patent [19]

Egawa et al.

[11] Patent Number: 5,130,524
[45] Date of Patent: Jul. 14, 1992

[54] APPARATUS FOR CONTROLLING INTENSITY OF LASER BEAM EMITTED FROM SEMICONDUCTOR LASER UNIT

[75] Inventors: Jiro Egawa, Yokosuka; Naoaki Ide, Yokohama, both of Japan

[73] Assignee: Kabushiki Kaisha Toshiba, Kawasaki, Japan

[21] Appl. No.: 634,557

[22] Filed: Dec. 27, 1990

[30] Foreign Application Priority Data

Dec. 28, 1989 [JP] Japan ................. 1-344405

[51] Int. Cl.$^5$ .................. G01J 1/32; G01D 9/42
[52] U.S. Cl. .................... 250/205; 346/108
[58] Field of Search .............. 250/205, 235, 236; 346/108; 359/212–219; 358/480, 481

[56] References Cited

U.S. PATENT DOCUMENTS

| 4,443,695 | 4/1984 | Kitamura | 250/205 |
| 4,710,779 | 12/1987 | Funaki et al. | 250/205 |
| 4,727,382 | 2/1988 | Negishi et al. | 346/108 |
| 4,831,247 | 5/1989 | Ishizaka | 250/205 |
| 4,853,934 | 8/1989 | Sakurai | 250/205 |
| 4,856,011 | 8/1989 | Shimada et al. | 250/205 |

Primary Examiner—David C. Nelms
Assistant Examiner—Michael Messinger
Attorney, Agent, or Firm—Foley & Lardner

[57] ABSTRACT

In an apparatus for adjusting the intensity of a light beam, a driving current which is gradually increased is supplied to a semiconductor laser in a warming-up mode. The intensity of the light beam is detected by a monitor detector and compared with a predetermined value. The comparison result is latched in a first latch circuit and a preset drive data is determined in accordance with the latched comparison data and stored in a memory. The semiconductor laser is driven in a printing mode, in accordance with the preset drive data stored in the memory mode so that a printing condition can be established in a relatively short time. In the printing mode, the intensity of the light beam is adjusted in accordance with the comparison result obtained in the printing mode.

13 Claims, 10 Drawing Sheets

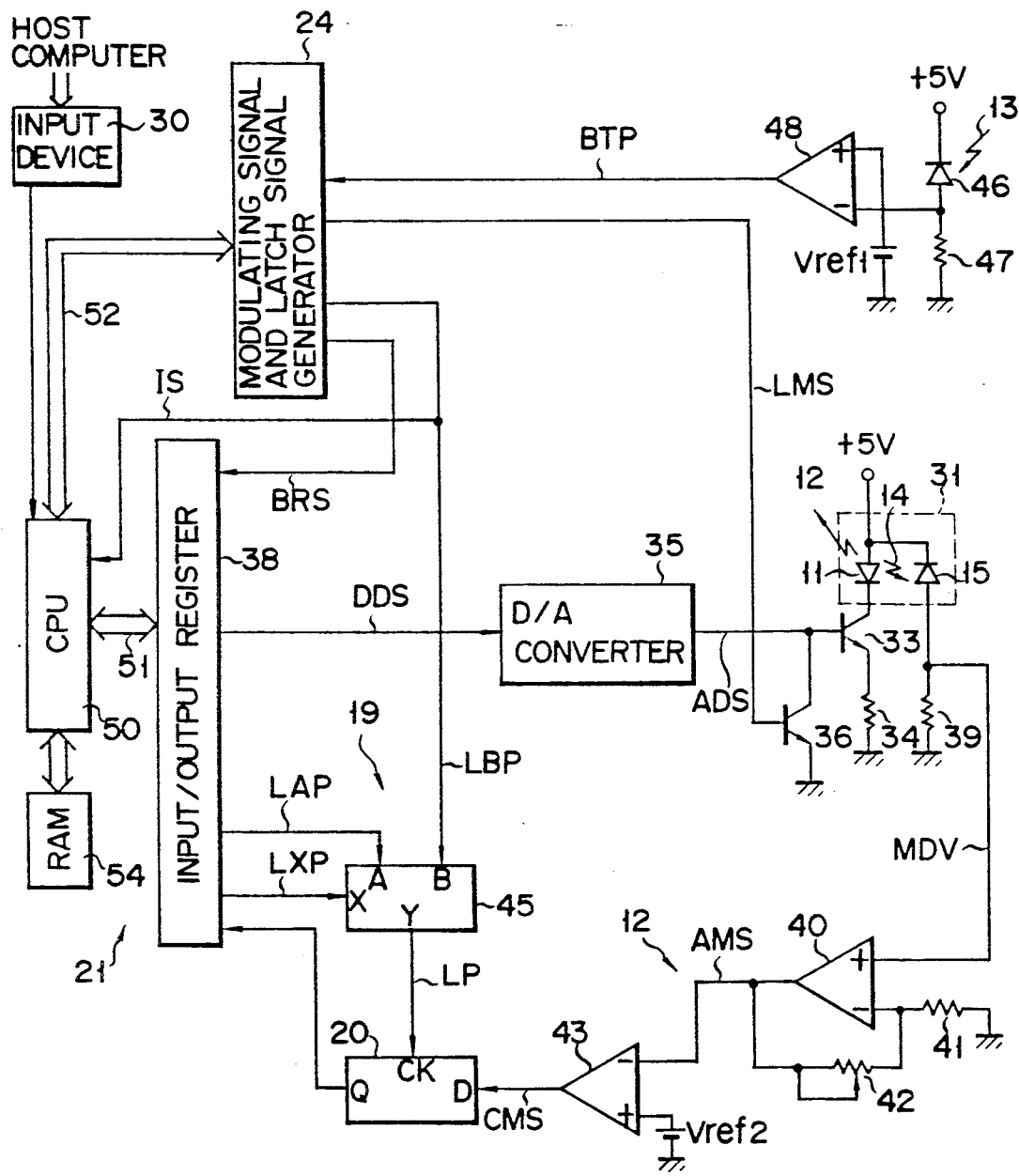
F I G. 2

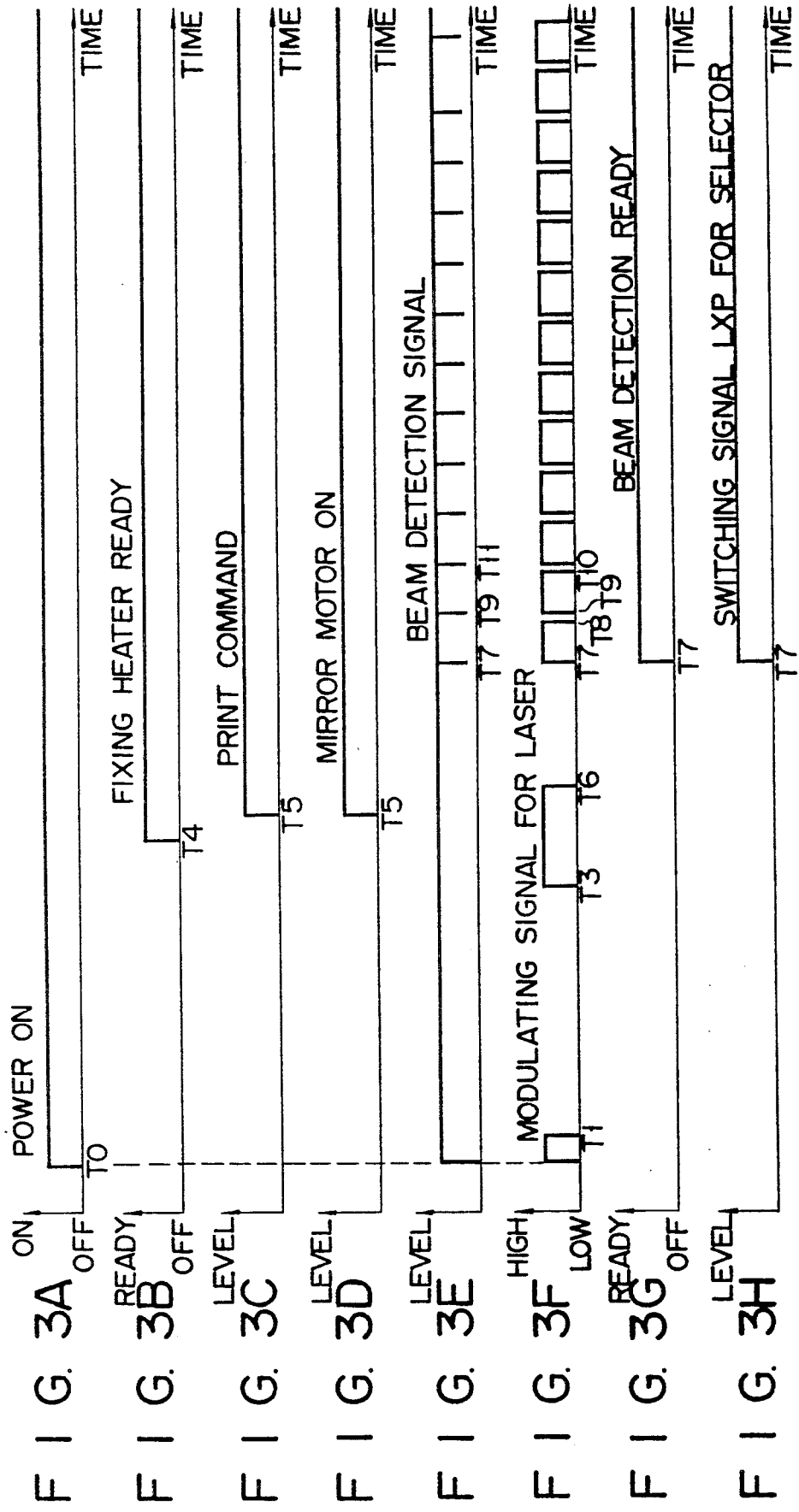

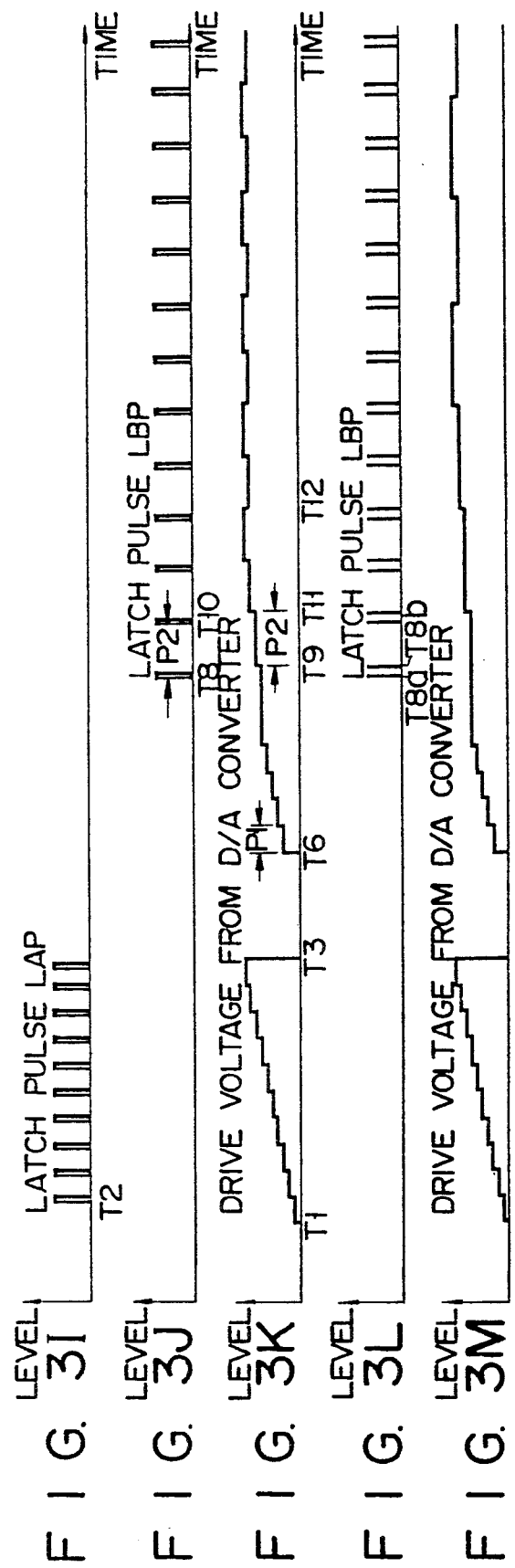

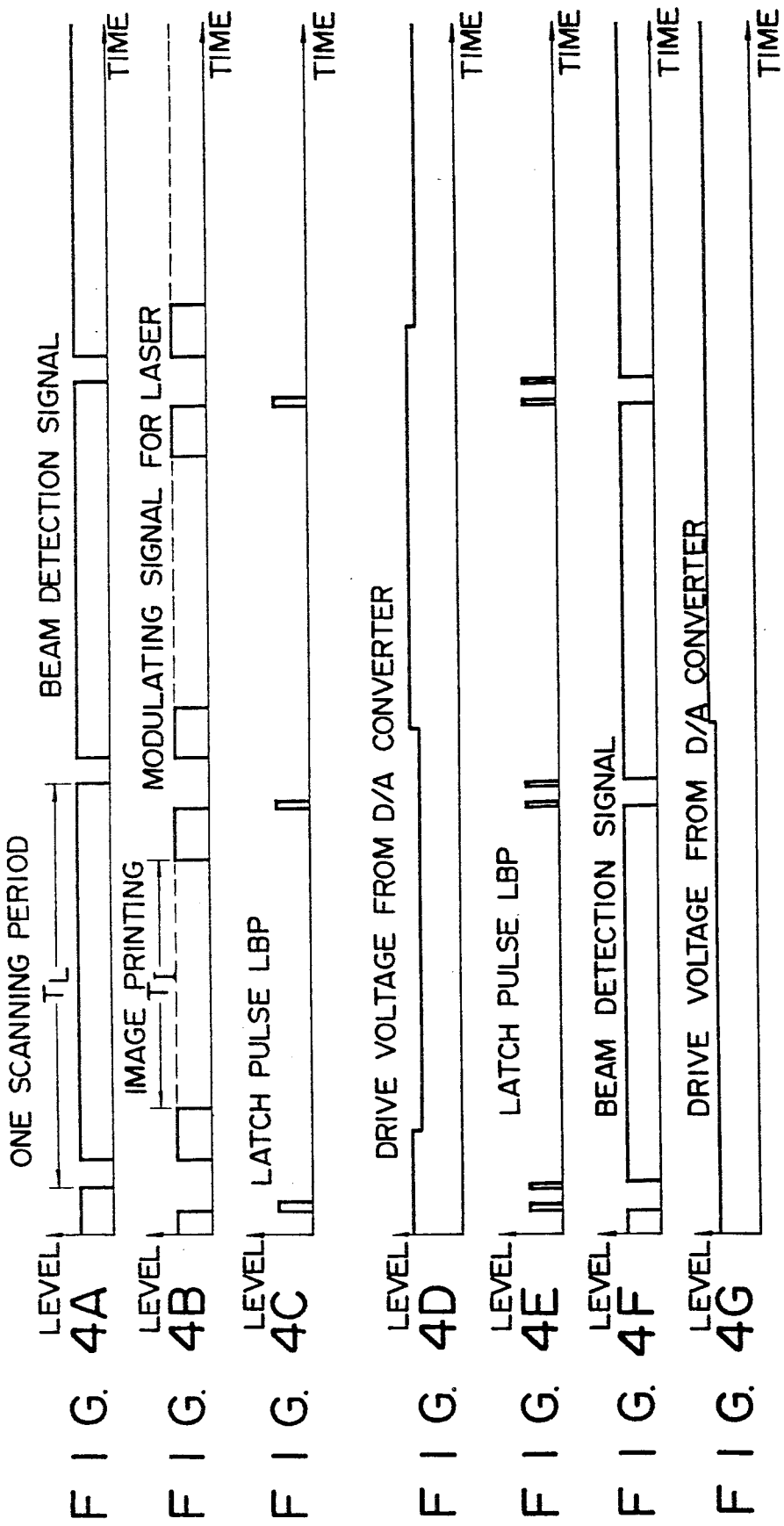

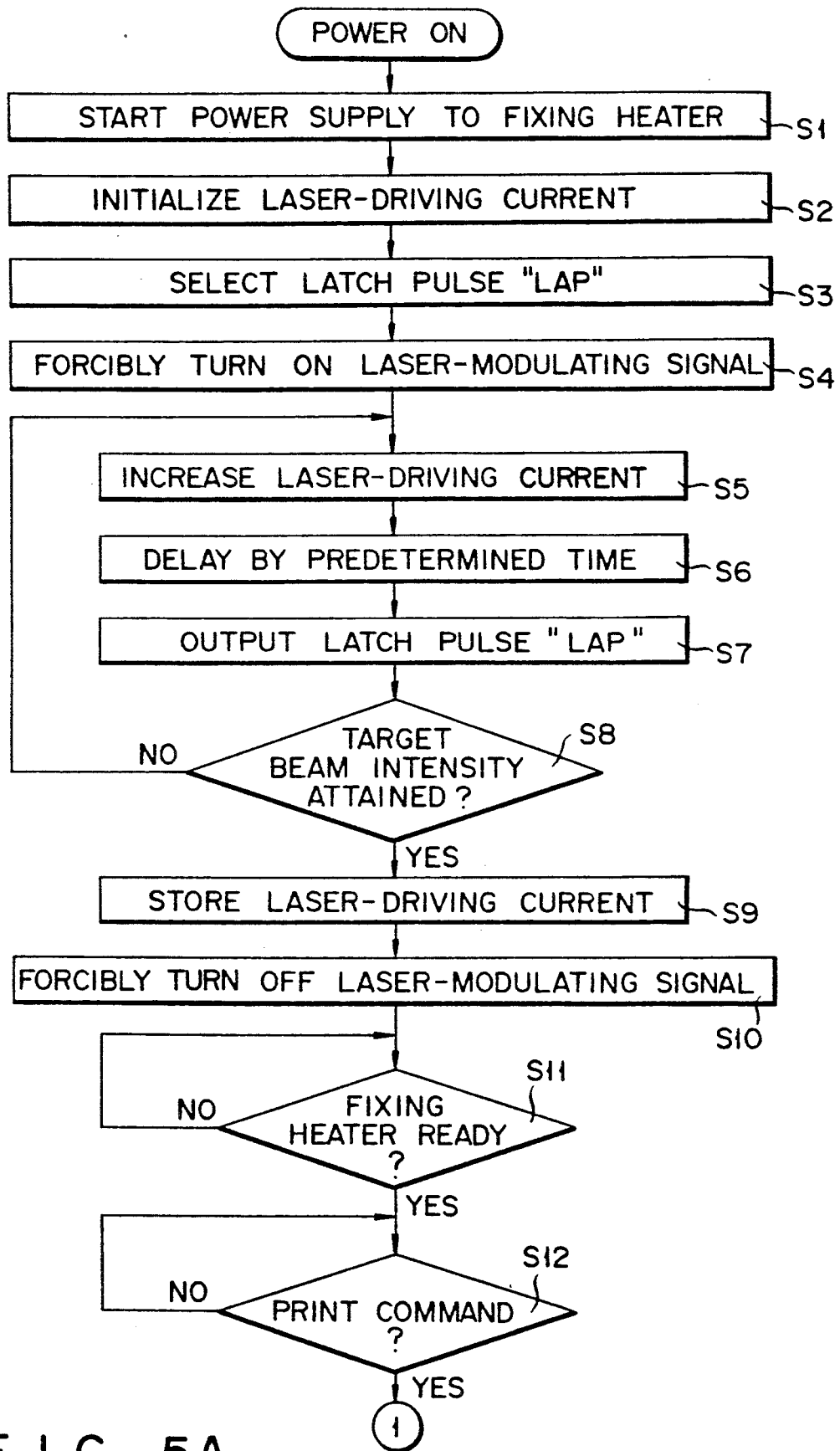
F I G. 5A

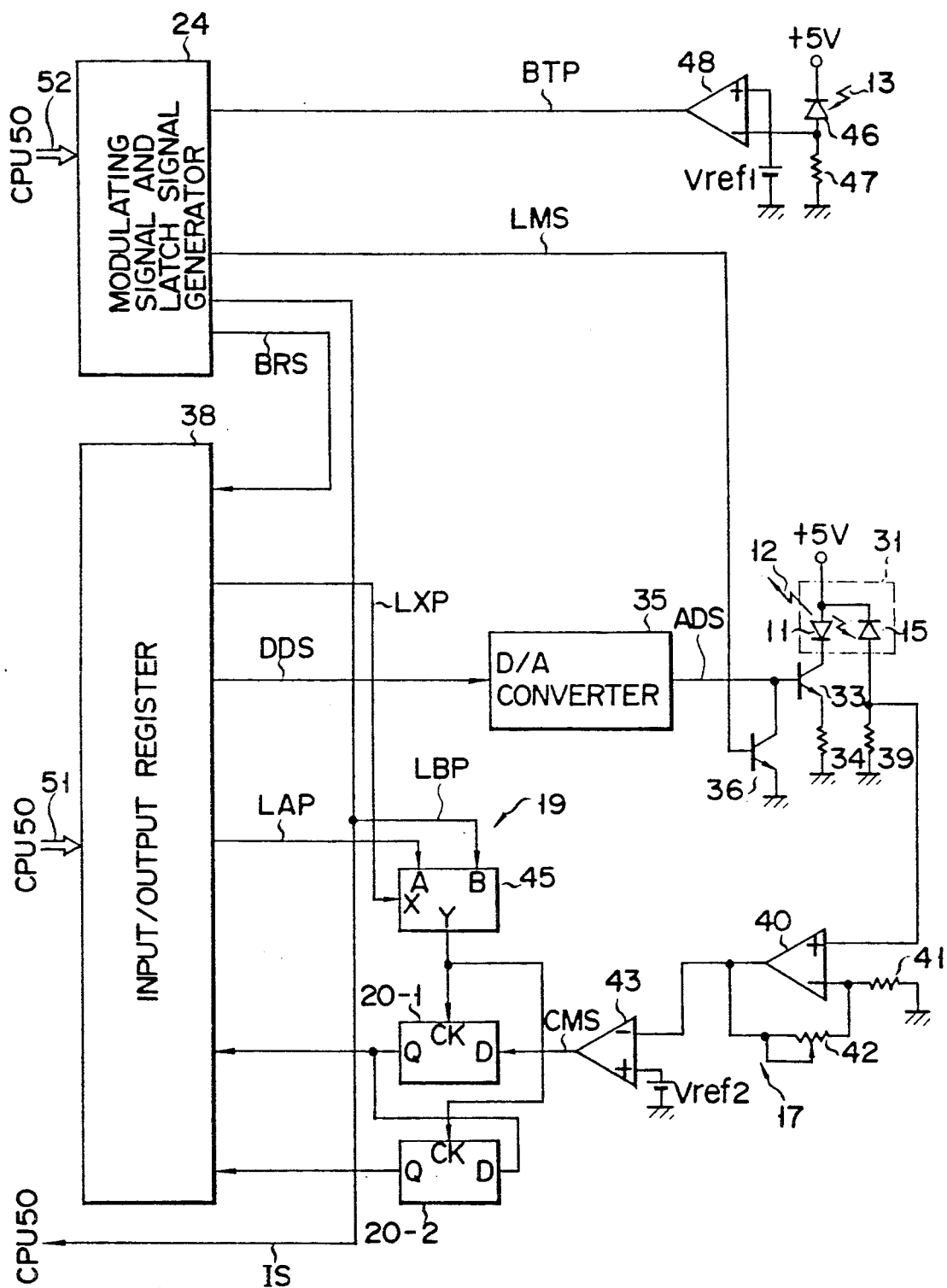
F I G. 6

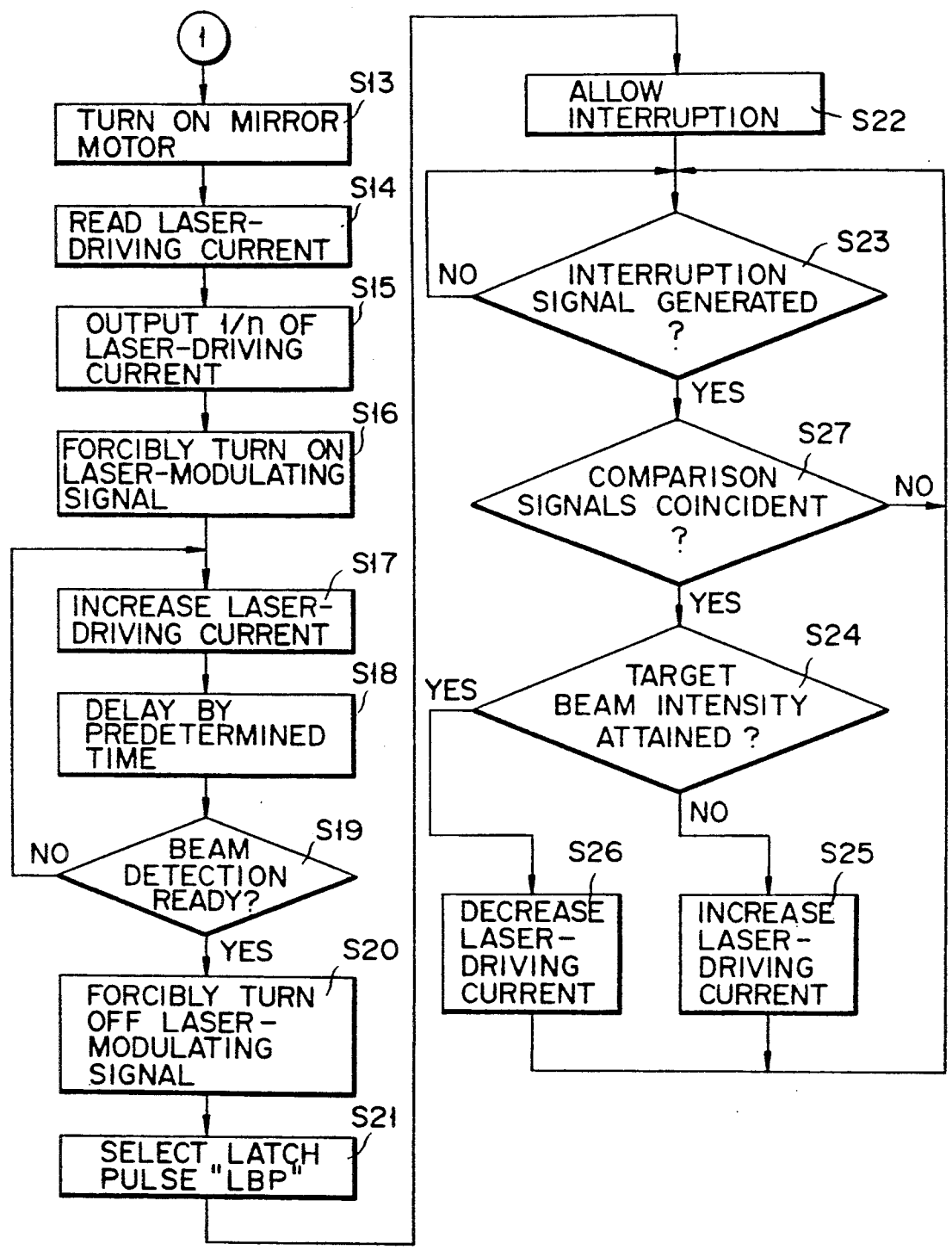
F I G. 7

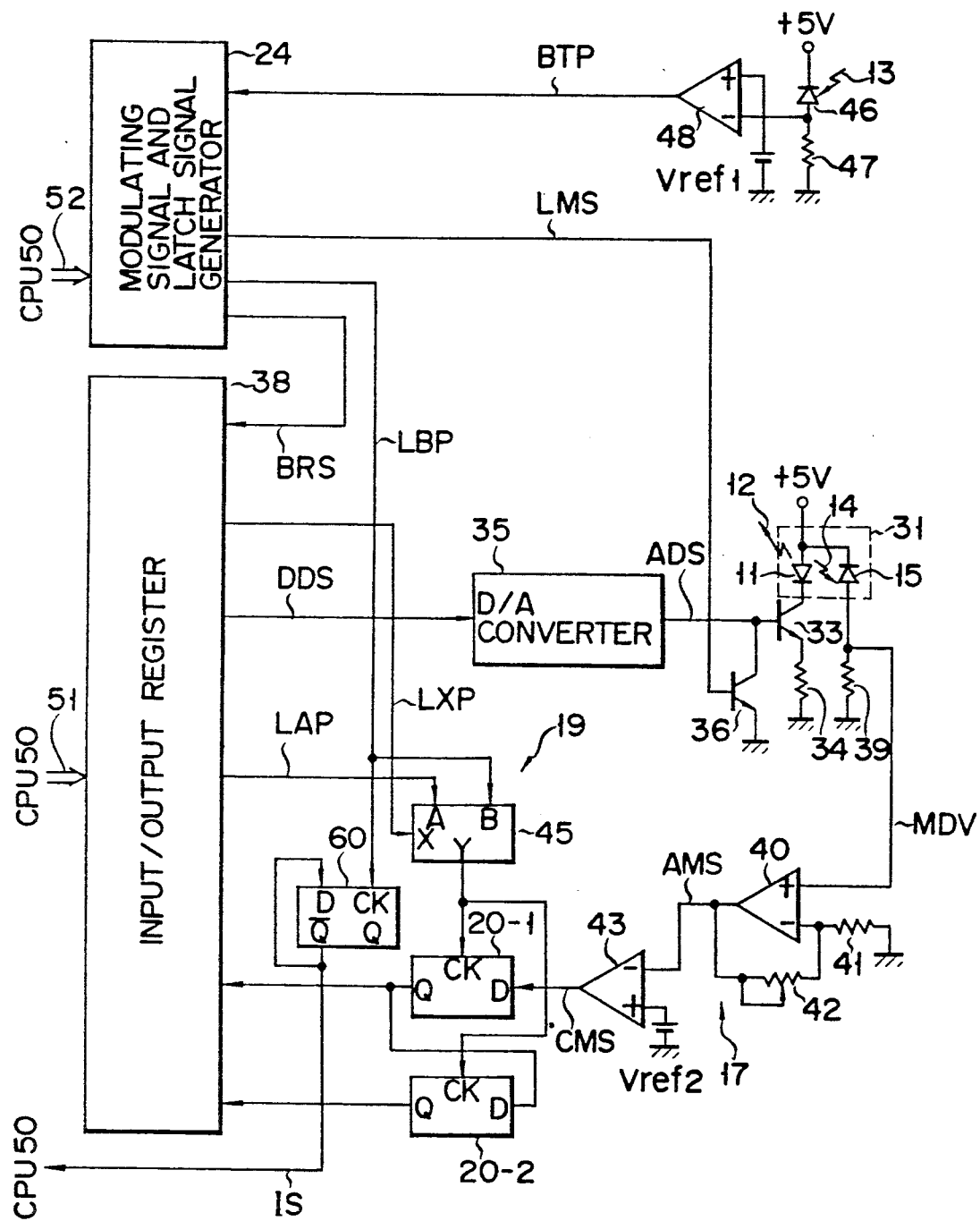
F I G. 8

APPARATUS FOR CONTROLLING INTENSITY OF LASER BEAM EMITTED FROM SEMICONDUCTOR LASER UNIT

BACKGROUND OF THE INVENTION

1. Field of the Invention

The present invention relates to an apparatus which controls the intensity of a laser beam emitted from a laser unit, and more particularly to a beam intensity-controlling apparatus adapted for use with a semiconductor laser unit incorporated in an image-forming apparatus, such as a laser printer or a digital copying machine.

2. Description of the Related Art

In recent years, an electrophotographic laser printer has been developed, which scans a photosensitive surface with the laser beam emitted from a laser unit for the purpose of exposure and which prints images and/or characters by utilization of an electrophotographic process. In this type of laser printer, the laser unit is constituted by a semiconductor laser unit. In general, the beam intensity of the laser beam emitted from the semiconductor laser unit has to be stabilized by a control device since the beam intensity is likely to vary in accordance with temperature.

There are various types of known control systems which can control the intensity of the laser beam emitted from the semiconductor laser unit. Of the known control systems, the control system which employs a general-purpose microcomputer or microprocessor incorporating an A/D converter is considered a low-cost type. In this type of control system, the semiconductor laser is energized to emit a laser beam and a detector detects the beam intensity of a laser beam during &he interval between the image-recording operation performed with respect to a given page and the image-recording operation performed with respect to the succeeding page, and the detected beam intensity is supplied to the A/D converter, for reading. The beam intensity read by the A/D converter is compared with a reference signal by the microcomputer and its peripheral circuits, and the current used for the driving of the semiconductor laser unit is controlled on the basis of the comparison. In this manner, the intensity of the laser beam emitted from the semiconductor laser unit is stabilized.

According to the conventional control system mentioned above, the intensity of the laser beam emitted from the semiconductor laser unit is stabilized, by causing the semiconductor laser unit to emit a laser beam in the interval which is between the image-recording operations performed with respect to two successive pages, i.e., in the interval in which the image-recording operation is not performed. If this control system is used in a certain type of image-forming apparatus (e.g., a laser printer or a digital copying machine to which a reversal development system is applied), the laser beam emitted in the interval between the image-recording operations may fall on a recording region. If this occurs, the image on the recording region is developed with toner, so that the toner is used in vain.

According to another type of control system which may solve the above problem, the intensity of a laser beam emitted from the semiconductor laser unit is stabilized, with the semiconductor laser unit being energized in the region other than the recording region. According to this control system, however, the time during which the semiconductor laser unit is energized is comparatively short, and the A/D converter incorporated in the general-purpose microcomputer requires a long time for reliably reading the detected beam intensity of the semiconductor laser unit. This being so, it is necessary to employ a high-speed A/D converter, i.e., a costly A/D converter. It is also necessary to employ a high-speed microcomputer since high-speed processing is required from the reading of the detected beam intensity to the determination of the driving current supplied to the semiconductor laser unit.

The conventional control apparatus mentioned above operates as follows. Upon receipt of a print command for commanding the start of printing, the conventional control apparatus first initializes the value of the current used for driving the semiconductor laser unit, and then controls the semiconductor laser unit such that its laser beam intensity attains a target beam intensity. Therefore, a certain time is required before the laser beam attains the target beam intensity.

In the case of an image forming apparatus, such as a laser printer or a digital copying machine, it is desirable that the time required from the input of the print- or copy-starting command to the execution of the first printing operation (or the production of the first copy) be short as possible. An image forming apparatus capable of promptly executing the first printing operation (or the projection of the first copy) is considered a high-performance apparatus. If the time required for the laser beam to attain the target beam intensity is long, the start of the copying or printing operation is delayed, so that the user has to wait for a long time before the first copy is produced.

In the case of a high-speed laser printer or digital copying machine, the time needed before the start of the first printing or copying operation is short. The higher the operation speed of the laser printer or digital copying machine is, the shorter will be the time required before the start of the first printing or copying operation. If, however, the time needed for attainment of the target beam intensity is long, it is not possible to make the most of the high-speed operation of the laser printer or digital copying machine.

According to the conventional control apparatus, when the laser beam emitted from the semiconductor laser unit is directed to the region other than the recording region, the semiconductor laser unit is energized, and the beam intensity of the laser beam is stabilized. The beam emission timing of the semiconductor laser unit is determined in accordance with a beam detection signal which is output by a beam detector when the laser beam reaches the region other than the recording region. In general, the beam detector is an optical detector. This detector cannot detect a laser beam incident thereon until the beam intensity of the semiconductor laser unit attains a given level which is high enough for the detector to sense. Therefore, in order to control the beam intensity of the semiconductor laser unit in the region other than the recording region, the driving current of the semiconductor laser unit has to be determined such that laser beam intensity can attain the given level, first of all.

The initial driving current has to be determined in consideration of the threshold current value and characteristic variation (e.g., in a variation in slope efficiency). Unless these factors are considered, it may happen that the laser beam emitted from the semiconductor laser unit will fail to attain the given beam intensity, resulting in failure in beam detection, even if the same value as used last time is set for the driving current. Conversely, it may happen that the laser beam will greatly exceed the given beam intensity, resulting in damage or adverse effects to the semiconductor laser unit.

SUMMARY OF THE INVENTION

Accordingly, an object of the present invention is to provide a beam intensity controller capable of controlling the intensity of a laser beam emitted from a semiconductor laser unit, in a stable manner and with high responsiveness.

Another object of the present invention is to provide a beam intensity controller for a laser oscillator, which is capable of controlling the beam intensity of the laser beam of the laser oscillator in response to the input of a command for starting image formation and which permits the laser beam to have a target beam intensity within a comparatively short time from the start of beam intensity control.

Still another object of the present invention is to provide a beam intensity controller for a laser oscillator, which is capable of reliably controlling the beam intensity of the laser beam of the laser oscillator in the region other than the recording region within a short time from the output of a beam detection signal.

According to the present invention, there is provided an apparatus for controlling the beam intensity of a light beam, comprising:

means for generating the light beam;

first driving means for driving the generating means with a driving current, the driving current being gradually increased in a warming-up mode;

means for detecting a intensity of the light beam generated by the generating means;

means for comparing the intensity of the light beam detected by the detecting means with a predetermined reference value;

means for determining a preset drive data corresponding to the predetermined intensity of the light beam in response to the comparison result and storing the predetermined preset drive data; and second driving means for driving said generating means with the preset drive data stored in the determining means, in a printing mode.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 2 is a block circuit diagram showing details of part of a beam intensity controller employed in the apparatus shown in FIG. 1;

FIGS. 3A, 3B, 3C, 3D, 3E, 3F, 3G, 3H, 3I, 3J, 3K, 3L, and 3M are timing charts for explaining the operation of the FIG. 2 apparatus and the operation of an apparatus obtained by modifying the FIG. 2 apparatus;

FIGS. 4A, 4B, 4C, 4D, 4E, 4F and 4G are partially-enlarged timing charts corresponding to those shown in FIGS. 3E, 3F, 3I, 3K, 3L and 3M, respectively;

FIG. 4F is a timing chart showing an interruption signal used in the apparatus of the modification;

FIGS. 5A and 5B are flowcharts for explaining the operation of the FIG. 2 apparatus;

FIG. 6 is a block circuit diagram of an apparatus obtained by modifying the FIG. 2 apparatus;

FIG. 7 is a flowchart for explaining the operation of the FIG. 6 apparatus; and

FIG. 8 is a block circuit diagram of another apparatus obtained by modifying the FIG. 2 apparatus.

DETAILED DESCRIPTION OF THE PREFERRED EMBODIMENTS

One embodiment of the present invention will now be described, with reference to the accompanying drawings.

Figure 1:
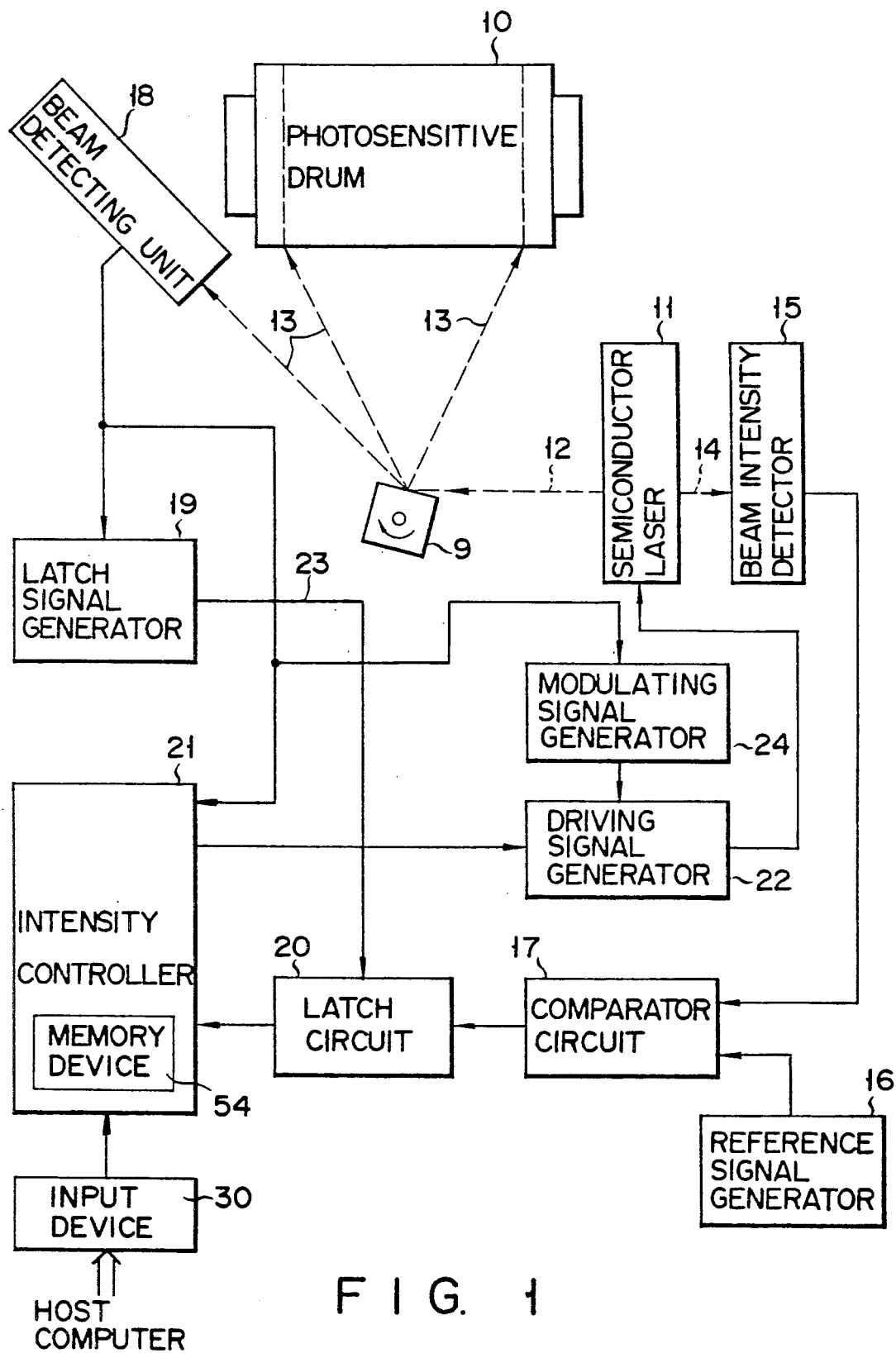
FIG. 1 is a block circuit diagram of an apparatus according to one embodiment of the present invention, which apparatus controls the intensity of the laser beam emitted from a semiconductor laser unit.

FIG. 1 is a block circuit diagram of an apparatus according to one embodiment of the present invention, the apparatus being for controlling the intensity of the laser beam emitted from a semiconductor laser unit. In the apparatus shown in FIG. 1, the laser beam emitted from a semiconductor laser 11 is directed to a polygonal mirror 9, as is indicated by reference numeral 12, and is then deflected toward a photosensitive drum 10. The photosensitive drum 10 is scanned with the laser beam 12, so that an electrostatic latent image is formed on the photosensitive drum 10. When the laser beam 12 deflected by the polygonal mirror 9 is directed to the region which is outside the recording region of the photosensitive drum 10, a beam-detecting unit 18 detects a scanning point or position of the laser beam and outputs a beam detection signal.

The semiconductor laser 11 is driven by a drive signal generator 22. This drive signal generator 22 receives a modulation signal from a modulating signal generator 24 in synchronism with the output of the beam detection signal. In response to the modulation signal, the drive signal generator 22 drives the semiconductor laser 11 by supplying a current to thereto, such that image information is recorded on the predetermined region on the photosensitive drum 10 by use of the laser beam. The laser beam emitted from the semiconductor laser 11 is also directed to a beam intensity detector 15, as is indicated by reference numeral 14. This beam intensity detector 15 detects the beam intensity of the laser beam directed thereto and supplies a detection signal to a comparator circuit 17. The comparator circuit 17 compares the detection signal supplied thereto from the beam intensity detector 15 with a reference signal supplied thereto from a reference signal generator 16, and outputs a comparison signal. A latch signal generator 19, which is connected to the beam detecting unit 18, generates a latch signal 23 in response to the beam detection signal output by the beam-detecting unit 18, i.e., in synchronism with the time at which the laser beam deflected by the polygonal mirror 9 has reached the region outside the recording region. A latch circuit 20 is connected to the comparator circuit 17, and latches the comparison signal supplied thereto from the comparator circuit 17, in response to the latch signal 23. An intensity controller 21 determines the driving current to be supplied to the driving signal generator 22 in accordance with the comparison signal latched in the latch circuit 20. In this manner, the intensity of the laser beam emitted from the semiconductor laser 11 is controlled to be constant.

An input device 30 (e.g., a host computer 30) is connected to the intensity controller 21. A print command for starting a printing operation is entered from the input device 30. In response to the print command, the circuit shown in FIG. 1 starts a beam intensity control operation. As is shown in FIG. 2, the intensity controller 21 comprises a memory device 54 constituted for example by a RAM. This memory device 54 stores a driving data corresponding to a preset drive current which start to energize the semiconductor laser 11 in response to a print command in a print ready mode. The preset drive current is determined in a warming-up mode on the basis of the comparison signal. More specifically, the warming-up mode is started when the printer apparatus is energized or turned on and is continued until the print-ready mode is established. During this warming-up mode, the drive current is stepwisely increased and the beam intensity of the semiconductor laser 11 is also increased in accordance with a control program stored in a ROM (not shown) so that the beam intensity is reached to a target value and the drive current corresponding to the target beam intensity is determined. Thus, the preset drive data is stored in the RAM 54. Therefore, the drive current is lowered, the print heater is ready and the warming-up mode is finished so that the print ready mode is established. In the this ready mode, when the print command is entered from the input device 30, the preset drive current is read out from the ROM 54 as the current data and the preset current is applied to the semiconductor laser unit 11 from the driving signal generator 24. Thus, the intensity controller 21 starts to control the semiconductor laser 11 until the beam intensity of the laser beam attains the target beam intensity. That is, the intensity controller 21 controls the driving signal generator 24 in such a manner that the drive current from the driving signal generator 24 is stepwisely increased and generates a latch signal to the latch circuit. Therefore, the comparison signal output from the latch circuit 17 is latch circuit 20 in the predetermined cycle, and the comparison signal latched in the intensity controller 21 is fetched in the predetermined cycle. When the beam detection signal is output from the beam-detecting unit 18, a comparison signal is latched in the latch circuit 20 in response to a latch signal whose period corresponds to that of the beam detection signal. In accordance with the latched comparison signal, the driving current of the driving signal generator 22 is determined, to thereby uniformly control the beam intensity of the laser beam emitted from the semiconductor laser 11.

FIG. 2 is a block circuit diagram illustrating a detailed structure of the intensity controller 21 shown in FIG. 1, along with its peripheral circuits. As is shown in FIG. 2, a semiconductor laser unit 31 is made up of a laser diode 11 and a photodiode 15. The laser diode 11 constitutes the semiconductor laser mentioned above, while the photodiode 15 constitutes a beam intensity detector which detects the intensity of a laser beam output from the laser diode 11, for monitoring. The laser diode 11 is driven with a constant current which is supplied from a constant-current circuit made up of a transistor 33 and a resistor 34. The output terminal of a D/A converter 35, which converts a digital driving signal DDS to an analog driving signal ADS, is connected to the base of transistor 33. The collector of transistor 36 is also connected to the base of transistor 33. With this circuit arrangement, the driving current flowing through the laser diode 11 varies in proportion to the output voltage ADS of the D/A converter 35.

Transistor 36 is repeatedly turned on or off in accordance with a laser-modulating signal LMS output from the modulating signal generator 24, so that the laser diode 11 is modulated and emits an intensity-modulated laser beam 12. In the circuit of this embodiment, the laser diode 11 is de-energized when the laser-modulating signal LMS is at the high level, and is energized and emits a laser beam when the laser-modulating signal LMS is at the low level. In the D/A converter 35, the digital driving signal DDS (a current signal) output from an input/output register 38 is converted into the analog driving signal ADS (a voltage signal).

A current flowing through the monitoring photodiode 15 varies in proportion to the intensity of the laser beam 14 generated by the laser diode 11. To convert the current flowing through the photodiode 15 into a voltage, a resistor 39 is connected between the photodiode 15 and the ground. A detection voltage MDV obtained by resistor 39 is supplied to the amplifier circuit 17, which is made up of an operation amplifier 40, a resistor 41, a variable resistor 42, and a comparator 43. More specifically, the detection voltage MDV is supplied to the operation amplifier 40 of the comparator circuit 17. This amplifier 40 constitutes a non-inversion type amplifier, by which the detection voltage MDV is amplified without being inverted. It should be noted that the variable resistor 42 is employed for the purpose of adjusting the amplification factor. The current flowing through the photodiode 15 may differ, depending upon the characteristic variation of the laser diode 11 so that the detection voltage MDV may differs. However, the amplified signal AMS from the operational amplified 40 can be so corrected such that the amplified signal corresponding to the intensity of the laser beam emitted from the laser diode 11 by adequately determining the amplification factor, i.e., by adjusting the resistance of the variable resistor. An amplified signal AMS, produced from the operation amplifier 40, is supplied to the negative input terminal of the comparator 43, and is compared with a reference voltage Vref2 supplied to the positive input terminal of the comparator 43. The level of the reference voltage Vref2 is determined in accordance with the desirable target intensity of the laser beam emitted from the laser diode 11. If the level of the output of the operation amplifier 40 is lower than that of the reference voltage Vref2, the output CMS of the comparator 43 becomes high in level, on the assumption that the laser beam has not yet attained the target beam intensity. If the level of the output AMS of the operation amplifier 40 exceeds the level of the reference voltage Vref2, the output of the comparator 43 becomes low in level, on the assumption that the intensity of the laser beam has exceeded the target beam intensity. A comparison signal CMS output from the comparator 43 is supplied to the latch circuit 20. The comparison signal CMS is latched in the latch circuit 20 in synchronism with an input latch pulse Lp supplied from a selector 45. An output of this latch circuit 20 is supplied to the input/output register 38, and is then processed by a CPU 50, for the control of the entire printer. The selector 45 selects either an input latch pulse LAP or an input latch pulse LBP, in accordance with a latch pulse-switching signal LXP supplied from the input/output register 21. The latch pulse LAP is output from the input/output register 38, while the latch pulse LBP is output from the modulating signal generator 24. In the case of this embodiment, the selector 45 selects input latch pulse LAP if the latch pulse-switching signal LXP is low in level, and selects input latch pulse LBP if the latch pulse-selecting signal LXP is high in level.

The beam detecting unit 18 such as a pin diode detects a scanning point or position which is scanned with the scanning laser beam 13. When the scanning laser beam 12 is incident on the pin diode 46, this pin diode 46 generates a current signal which is proportional to the intensity of the incident laser beam. The current signal is converted into a voltage signal by resistor 47. The voltage signal, thus obtained, is supplied to the negative terminal of a comparator 48, and is compared with a reference voltage Vref1 which is supplied to the positive terminal of the comparator 48. The result of this comparison is output as a negative pulse beam-detecting signal BTP, and is supplied to the modulating signal generator 24.

Upon receipt of the beam-detecting signal BTP, the modulating signal generator 24 changes the level of a beam-detection-ready signal BRS from low to high. (The beam-detection-ready signal BRS is supplied from the modulating signal generator 24 to the input/output register 38, to inform the input/output register 38 that the beam detection is ready.) The latch pulse-selecting signal LXP output from the input/output register 38 has a low level when the level of the beam-detection-ready signal BRS is low in level, and has a high level when the level of the beam-detection-ready signal BRS is high in level. When the beam-detection signal BTP is output, the modulating signal generator 24 generates an input latch pulse LBP on the assumption that the laser beam has reached the region outside the recording region. The input latch pulse LBP is supplied to the interruption terminal of the CPU 50 as an interruption signal IS. An internal bus 51 of the CPU 50 is connected to the input/output register 38, and to the modulating signal generator 24 by way of an internal bus 52.

The operation of the circuit shown in FIG. 2 will now be described, with reference to the timing charts shown in FIGS. 3A-3K and FIGS. 4A-4D and the flowcharts shown in FIGS. 5A and 5B.

Referring to FIG. 5A, when the power source is turned on at time T0 (FIG. 3A), a warming-up operation of the apparatus is started. In other words, the current supply to a fixing heater is started in step S1. The fixing heater becomes ready for fixing at time T4 (FIG. 3B), which is a predetermined time after time T0. After time T0, the laser-driving current output from the input/output register 38 is initialized in step S2. Next, in step S3, the selector 45 selects the input latch pulse LAP coming from the register 38, in accordance with the latch pulse-selecting signal LXP (FIG. 3H) output from the input/output register 38. As is shown in FIG. 3I, the supply of the latch pulse LAP to the latch circuit 20 is started from time T2. Next, in step S4, the laser-modulating signal output from the modulating signal generator 24 is forcibly turned on, as is indicated in FIG. 3F, and the low-level driving signal is applied to transistor 36, thereby turning off this transistor 36. Next, in step S5, the laser-driving current is increased with a predetermined increment from time T1. The increased laser-driving current is output from the input/output register 38, and is then supplied to the D/A converter 35, for D/A conversion, whereby the laser-driving current is converted into a voltage signal ADS (FIG. 3K). This voltage signal ADS is applied to transistor 33, so that the current supply to the laser diode 11 is started.

At time T2, which is a time delayed by a predetermined length of time in step S6, the generation of the input latch pulse LAP is started in step S7. In synchronism with the input latch pulse LAP from the selector 45, the comparison signal output from the comparator 43 latched in the latch circuit 20 in a predetermined cycle. Next, in step S8, the CPU 50 determines whether or not the laser beam emitted from the semiconductor laser 11 has attained &he target beam intensity, on the basis of the comparison signal latched in the latch circuit 20. The attainment of the target beam intensity means that the output voltage of the comparator 43 has reached the same level as the reference voltage Vref2 of the comparator 43. Accordingly, the output of the comparator 43 is changed from "1" to "0".

If it is determined in step S8 that the laser beam has not yet attained the target beam intensity, then the flow returns to step S5, and steps S5-S8 are repeated until the target beam intensity is attained. If it is determined in step S8 that the target beam intensity has been attained, then the flow advances to step S9. In this step S9, the preset value of the laser-driving current is stored in RAM 54. Next, in step S10, the laser-modulating signal LMS is forcibly turned off, so that the laser-modulating signal is maintained at a high level from time T3 in the manner shown in FIG. 3F and the output of the D/A converter 35 drops in level at time T3 in the manner shown in FIG. 3K.

In step S11, a check is made to see whether the fixing heater is ready or not. This check is repeated until the fixing heater becomes ready, i.e., until the warming-up operation is completed. When the fixing heater becomes ready and the warming-up operation completed at time T4, as is indicated in FIG. 3B, the CPU 50 waits, in step S12, for a print command to be externally entered from an external apparatus, for example from the host computer. When the CPU 50 receives the print command via &he input device 30 at time T5, as is indicated in FIG. 3C, the mirror motor is turned on at time T5 (FIG. 3D) in step S13, and the preset value of the laser-driving signal (which value is stored in step S9) is read out of the RAM 54 in step S14. Next, in step S15, the present drive current whose preset value is 1/n of that of the laser-driving current corresponding to the target beam intensity and which is stored in RAM 54 is output from the input/output register 38 under the control of the CPU 50. In step S16, the laser-modulating signal is forcibly turned on at time T6 (FIG. 3F) and is maintained at a low level. In step S17, the laser-driving current is increased with an predetermined increment from time T6, as is indicated in FIG. 3K.

In step 18, the CPU 50 determines whether beam-detection-ready signal BRS from the modulating signal generator 24 is ready or not, when a predetermined length of time has elapsed from time T6. The state where the beam detection is ready is a state where the beam intensity of the scanning beam incident on the beam detector 46 exceeds the level of the reference voltage Vref1 of the comparator 48. If it is determined in step S19 that the beam detection is not ready, then the flow returns to step S17, and steps S17-19 are repeated until the beam detection becomes ready. That is, the drive current for driving the semiconductor laser 11 is gradually increased so that the beam intensity of the laser beam is gradually increased.

When it is determined in step S19 that the beam detection is ready, step S20 is executed, wherein the laser-modulating signal is forcibly turned off at time T7, as is indicated in FIG. 3F. The modulating signal generator 24 outputs a beam-detection-ready signal. Further, the input/output register 38 outputs a latch pulse-switching signal LXP at time T7, as is indicated in FIG. 3H. In step S21, therefore, the selector 45 selects input latch pulse LBP instead of input latch pulse LAP. When a predetermined length of time has elapsed from time T7 (i.e. from the generation of the beam detection signal), the laser beam is directed to the region outside of the photosensitive drum 10. At the time (i.e., at time T8), the level of the modulation signal generated by the modulating signal generator 24 is changed from high to low. Accordingly, the semiconductor laser emits a laser beam, for sampling. As is indicated in FIG. 3J, therefore, the latch pulse Lp corresponding to input latch pulse LBP is supplied from the selector 45 to the latch circuit 20.

After interruption is allowed in step S22, a check is made in step S23 to see whether or not the input latch pulse LBP which the CPU 50 receives is an interruption signal IS. This check is repeated until the CPU 50 identifies the interruption signal IS. When the CPU 50 identifies the interruption signal IS, the comparison signal output from the comparator 43 is latched in the latch circuit 20 by the latch pulse Lp. Next, in step S24, the CPU 50 determines whether or not the laser beam has attained the target beam intensity, on the basis of the comparison signal latched in the latch circuit 20. If the target beam intensity has not yet been attained, the laser-driving current is increased with a predetermined increment in in step S25, and the increased laser-driving current is supplied to the D/A converter 35. Accordingly, the voltage output from the D/A converter 35 is increased, as is indicated in FIG. 3K. Thereafter, the flow returns to step S23, and the above operation is repeated at a predetermined cycle P2 until the target beam intensity is attained. When the target beam intensity is attained, the laser-driving current is decreased with a predetermined decrement in step S26, so that the voltage output from the D/A converter 35 drops, as is indicated in FIG. 3K. Thereafter, the flow returns to step S23. That is, at time T9, the voltage output from the D/A converter 35 is increased, the beam-detection signal BTP is generated from the comparator 48, and the semiconductor laser 11 is de-energized, with the level of the laser-modulating signal LMS being changed from low to high. At time T10, the laser 11 is energized again, and the reference signal pertaining to a monitoring beam is latched. If the target beam intensity has not yet been attained, the voltage output from the D/A converter 35 is increased at time T11. If the target beam intensity has been attained, the voltage output from the D/A converter 35 is decreased at time T12. In this manner, the voltage output from the D/A converter is repeatedly increased or decreased. That is, after the target beam intensity is attained, the beam intensity of the semiconductor laser unit 11 is controlled each time an interruption signal is received by the CPU 50.

As described above, the laser beam is intensity-controlled at the predetermined period P1 until the beam detection signal is output, and the laser beam is also intensity-controlled at the predetermined period P2 after the beam detection signal is output. FIGS. 4A-4D are enlarged timing charts, of which FIG. 4A corresponds to FIG. 3E and shows a beam-detecting signal produced after the attainment of the target beam intensity, FIG. 4B corresponds to FIG. 3F and shows a modulation signal, FIG. 4C corresponds to FIG. 3J and shows an input latch pulse LB, and FIG. 4D corresponds to FIG. 3K and shows a voltage signal produced from the D/A converter 35. As is indicated in FIG. 4A, the laser beam scans one line during period TL, in which a beam-detecting signal is detected. As is indicated in FIG. 4B, the modulation signal is modulated with externally-supplied image information in period TI, to thereby record an image on the photosensitive drum 10.

In the embodiment mentioned above, a comparison signal is latched each time one line is scanned with the laser beam, and the beam intensity of the semiconductor laser unit is controlled in accordance with the latched comparison signal. However, this in no way limits the present invention. For example, a comparison signal may be latched each time a certain number of lines are scanned, and the beam intensity of the semiconductor laser unit may be controlled in accordance with such a latched comparison signal.

As detailed above, the subject beam intensity control apparatus does not initialize the driving current value of the semiconductor laser after the print command is input. It controls the beam intensity of the semiconductor laser unit on the basis of the driving current value data stored beforehand. Therefore, the light beam emitted from the semiconductor laser attains the target beam intensity within a short time after the start of the beam intensity control.

In the beam intensity control apparatus of the present invention, the beam intensity of the semiconductor laser unit is controlled in a predetermined cycle until the beam intensity of the semiconductor laser unit attains a given level which is high enough for the output of a detection signal. After the beam intensity attains the given level and the bean detection signal output, the beam intensity of the semiconductor laser unit is controlled on the beam detection signal. Accordingly, the beam intensity control can be reliably performed when the laser beam is directed to the region other than the recording region, without causing damage or adverse effects to the semiconductor laser unit. In addition, the beam intensity control is enabled immediately after the output of the beam detection signal.

One modification of the above-described beam intensity control apparatus will now be described, with reference to FIGS. 6 and 7.

The circuit shown in FIG. 6 differs from that shown in FIG. 2, in that a plurality of latch circuits 20-1 and 20-2 are employed for latching the comparison signal outputs from the comparator 43 and corresponding to the two scanning lines. In the the circuit shown in FIG. 6, the input latch signal LBP is generated from the modulating signal generator 24 at a predetermined interval in response to the beam-detecting signal BTP after the beam-detecting-ready BRS becomes ready for beam detection. The modulating signal generator LBP 23 are supplied to the latch circuits 20-1 and 20-2 through the selector 45. Therefore, a comparison signal, which is output from the comparator 43 and which represents the result obtained by comparison between the intensity of the optical beam used for describing different scanning lines and a reference beam intensity, is latched in both the latch circuits 20-1 and 20-2. More specifically, at time T8, which is after the generation of the detection signal BTP, latch signal LBP is supplied to latch circuits 20-1 and 20-2, as is indicated in FIGS. 3J and 4C. The light beam used for describing a given scanning line is monitored, and latch circuit 20-1 latches a comparison signal CMS obtained by comparing the beam intensity of the light beam with a reference intensity level. When the subsequent input latch signal LBP shown in FIGS. 3J and 4C is supplied to latch circuits 20-1 and 20-2 at time T10, the comparison signal corresponding to the above given scanning line is transferred from latch circuit 20-1 to latch circuit 20-2, and the comparison signal CMS corresponding to the subsequent scanning line is latched in latch circuit 20-1. A similar operation is repeated each time another latch signal is supplied to latch circuits 20-1 and 20-2. In this manner, the comparison signals latched in the two latch circuits and corresponding to the two scanning lines are updated.

Figure 5B:
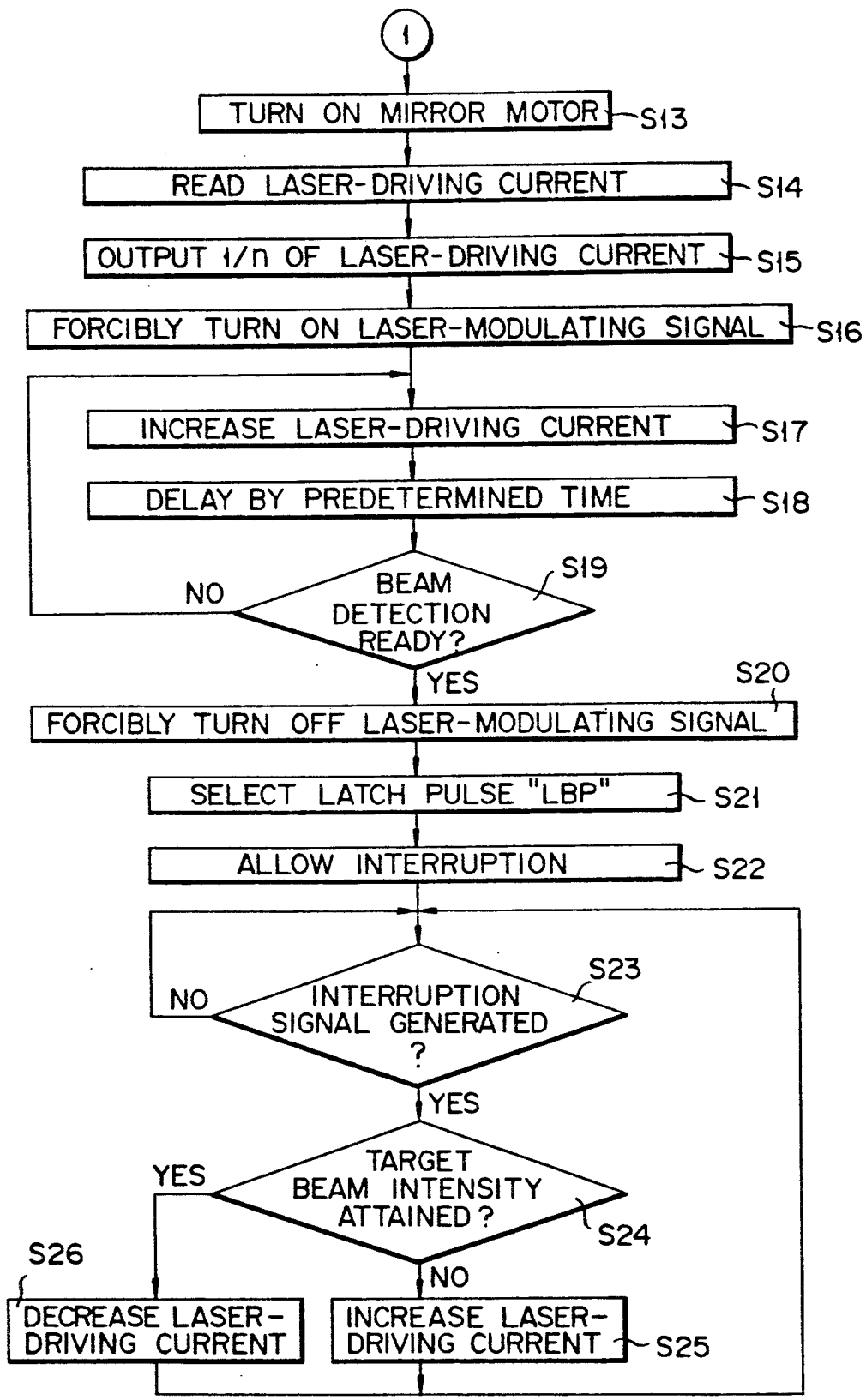

In the circuit shown in FIG. 6, the CPU 50 performs similar signal processing to that shown in FIGS. 5A and 5B, except that it compares the two comparison signals respectively latched in the latch circuits 20-1 and 20-2, for the detection of coincidence. More specifically, in step S21, the selector 45 selects input latch pulse LBP, in accordance with the latch pulse-switching signal LXP output from the input/output register 38. After interruption is allowed in step S22, the check in step S23 is repeated until an interruption signal is generated. At the time of generation of the interruption signal, the comparison signal output from the comparator 43 is latched in latch circuits 20-1 by use of the input latch pulse LBP and the comparison signal which has latched in the latch circuit 20-1 and corresponds to the preceding scanning line is latched in the latch circuit 20-2 by use of the next latch pulse LBP. In step S27, a check is made to see whether the comparison signals latched in latch circuits 20-1 and 20-2 are coincident with each other. If coincidence is detected between the two comparison signals, the flow advances to step S24; if not, the flow returns to step S23. In step S24, it is determined whether or not the laser beam has attained the target beam intensity, on the basis of the comparison signals latched in latch circuits 20-1 and 20-2. If the target beam intensity has not yet been attained, the laser-driving current is increased with a predetermined increment in step S25, and the increased laser-driving current is supplied to the D/A converter 35 as shown in FIGS. 3M and 4G. Thereafter, the flow returns to step S23, and the above operation is repeated until the target beam intensity is attained. When the target beam intensity is attained, the laser-driving current is decreased with a predetermined decrement in step S26, and the flow returns to step S23.

In the circuit shown in FIG. 6, the latch signal generator generates a latch signal in a region other than the recording region, on the basis of the beam-detecting signal, and the comparison signals which are output from the comparator and which correspond to a plurality of scanning lines are latched in the latch circuits by use of the latch signal. When coincidence is detected between the two latched comparison signals, the driving current supplied to the semiconductor laser unit is controlled on the basis of the comparison signals, to thereby control the beam intensity.

In the circuit shown in FIG. 6, the two comparison signals respectively corresponding to two scanning lines are latched, and when coincidence is detected between the two comparison signals, the beam intensity of the semiconductor laser unit is controlled in accordance with the comparison signals. However, the present invention is not limited to this. For example, it is possible to design an apparatus wherein comparison signals corresponding to three or more scanning lines are latched. In this case, the beam intensity of the semiconductor laser unit is controlled when coincidence is detected among the three or more comparison signals. Moreover, the comparison signals corresponding to a plurality of scanning lines need not be latched in different latch circuits; the use of a single latch circuit may be sufficient. In the case where the single latch circuit is used, the comparison signal corresponding to a given scanning line is first latched in the latch circuit, and is then transferred to a memory (RAM) when the comparison signal corresponding to the subsequent scanning line is latched in the single latch circuit. The comparison signal newly latched in the latch circuit is compared with the comparison signal stored in the memory, for the detection of coincidence.

Another modification of the beam intensity control apparatus will now be described, with reference to FIG. 8 and FIGS. 3L, 3M, 4E, 4F and 4G.

In the circuit shown in FIG. 8, a laser beam used for describing one scanning line is monitored, and a comparison signal is latched a number of times.

The circuit shown in FIG. 8 employs two latch circuits 20-1 and 20-2. It also employs a frequency-dividing circuit 60, for the control of interruption to the CPU 50. In the circuit, a two-pulse latch signal LBP (FIGS. 3L and 4E) is supplied to the selector 45.

When the first pulse component of the input latch signal LBP (FIGS. 3L and 4E) is supplied to the latch circuits 20-1 and 20-2 at time T8a (which is a predetermined time after the generation of the detecting signal BTP), the light beam used for describing a given scanning line is monitored, and a comparison signal CMS obtained by comparing the beam intensity of the light beam with a reference beam intensity level is latched in latch circuit 20-1. Thereafter, when the second pulse component of the input latch signal LBP is supplied to the latch circuits 20-1 and 20-2 at time T8b, the comparison signal already-latched in latch circuit 20-1 is latched in latch circuit 20-2, and the comparison signal CMS which corresponds the same scanning line but is delayed by a predetermined time is latched in latch circuit 20-1. In this manner, the comparison signals corresponding to two scanning lines are updated, each time a latch signal is supplied to latch circuits 20-1 and 20-2. The latch signal LBP is supplied to not only the latch circuits 20-1 and 20-2 but also the frequency-dividing circuit 60. In the frequency-dividing circuit 60, the frequency of the input latch signal LBP is divided into halves, and a signal obtained by this frequency division is supplied to the CPU 50 as an interruption signal IS. More specifically, when the first pulse component of the latch pulse LBP is supplied to the frequency-dividing circuit 60, its output falls, as is indicated in FIG. 4F. When the second pulse component of the latch pulse LBP is supplied to the frequency-dividing circuit 60, its output rises. In synchronism of a rise in the output of the frequency-dividing circuit 60, the CPU 50 starts an interruption operation.

In the circuit shown in FIG. 8, the CPU 50 performs similar signal processing to that shown in FIGS. 5A and 7. In step S21, the selector 45 selects input latch pulse LBP, in accordance with the latch pulse-switching signal LXP output from the input/output register 38. After interruption is allowed in step S22, the check in step S23 is repeated until an interruption signal is generated. At the time of generation of the interruption signal, the comparison signal output from the comparator 43 is latched in latch circuits 20-1 and 20-2 by use of the input latch pulse LBP. In step S27, a check is made to see whether the comparison signals latched in latch circuits 20-1 and 20-2 are coincident with each other. If coincidence is detected between the two comparison signals, the flow advances to step S24; if not, the flow returns to step S23. In step S24, it is determined whether or not the laser beam has attained the target beam intensity, on the basis of the comparison signals latched in latch circuits 20-1 and 20-2. If the target beam intensity has not yet been attained, the laser-driving current is increased with a predetermined increment in step S25, as is indicated in FIGS. 3K and 4D, and the increased laser-driving current is supplied to the D/A converter 35. Thereafter, the flow returns to step S24, and the above operation is repeated until the target beam intensity is attained. When the target beam intensity is attained, the laser-driving current is decreased with a predetermined decrement in step S25, and the flow returns to step S23.

In the circuit shown in FIG. 8, the latch signal generator generates a plurality of latch signals in a region other than the recording region, on the basis of the beam-detecting signal, and the comparison signals which are output from the comparator and which correspond to the comparison performed a plurality of times are latched in the latch circuits by use of the latch signal. When coincidence is detected between the latched comparison signals, the driving current to be supplied to the semiconductor laser unit is controlled on the basis of the comparison signals, to thereby control the beam amount.

Because of the control mentioned above, the semiconductor laser unit does not emit a laser beam in the interval in which image formation is not performed, i.e., in the interval between the image-forming operation performed for one page and the image-forming operation performed for the next page. Therefore, toner is prevented from being wasted, particularly in the case where a reversal development system is used. Further, the subject control system can be low in price since it eliminates the need to use a high-speed A/D converter.

The comparison result can be reliably read even if the time period in which the semiconductor laser unit emits a laser beam toward a region other than the recording region is short. In addition, since the value of a driving current is determined between the generation of a given latch signal and the generation of the subsequent latch signal, the microcomputer is allowed to have ample time for determining the driving current. This being so, the subject system can be low in price since it can employ a general-purpose microcomputer. In addition, the subject system is applicable even to a high-speed apparatus.

According to the circuit shown in FIG. 8, the result of comparison is latched twice, each time a laser beam scans one line, and when coincidence is detected between the latched comparison results, the amount of light emitted from the semiconductor laser unit is controlled in accordance with the comparison results. However, the result of comparison may be latched three or more times. In this case, the amount of light emitted from the semiconductor laser unit is controlled only when coincidence is detected among all the comparison results latched in the latch circuits.

As detailed above, the beam intensity control apparatus of the present invention can control the intensity of a laser beam emitted from a semiconductor laser unit, in a stable manner and with high responsiveness. In addition, the intensity control apparatus starts the control of the beam intensity of the laser oscillator in response to the input of a command for starting image formation and permits the laser beam to have a target beam intensity within a comparatively short time from the start of beam intensity control. Further, the beam intensity control can be reliably performed when the laser beam is directed to the region other than the recording region, without causing damage or adverse effects to the laser oscillator. Still further, the beam intensity control is enabled immediately after the output of the beam detection signal.

Additional advantages and modifications will readily occur to those skilled in the art. Therefore, the invention in its broader aspects is not limited to the specific details, and representative devices, shown and described herein. Accordingly, various modifications may be made without departing from the spirit or scope of the general inventive concept as defined by the appended claims and their equivalents.

What is claimed is:

1. An apparatus for adjusting the beam intensity of a light beam, adapted for a laser beam printing apparatus, comprising:
    means for generating the light beam;
    first driving means for driving the generating means with a driving current, the driving current being gradually increased in a warming-up mode;
    means for detecting a intensity of the light beam generated by the generating means;
    means for comparing the intensity of the light beam detected by the detecting means with a predetermined reference value;
    means for determining a preset drive data corresponding to the predetermined intensity of the light beam in response to the comparison result and storing the predetermined preset drive data; and
    second driving means for driving said generating means with the preset drive data stored in the determining means, in a printing mode.

2. An apparatus according to claim 1, further comprising:
    means for entering a initialize command in the warming-up mode, storing means being initialized in response to the initialize command.

3. An apparatus according to claim 1, further comprising:
    means for deflecting the light beam generated by the generating means;
    means for detecting the deflected light beam to generate a detection signal; and
    means, responsive to the detection signal, for latching the comparison signal output by the comparing means.

4. An apparatus according to claim 1, further comprising:
    an image carrier which is scanned with the light beam and forms a latent image thereon.

5. An apparatus according to claim 3, wherein said latching means includes:
   means for generating a latch signal; and
   means for latching the comparison result in response to the latch signal.

6. An apparatus according to claim 3, further comprising:
   second latching means for latching a second comparison result in accordance with a second detection signal output from the detecting means.

7. An apparatus according to claim 3, wherein said latching means includes:
   means for generating a latch signal;
   first latch means for latching the comparison result in response to the latch signal; and
   second latch means for latching the comparison result transferred thereto from the first latch means, in response to another latch signal.

8. An apparatus according to claim 6, wherein said energizing means includes means for comparing the first and second comparison results with each other and for controlling the driving current when coincidence is detected between the first and second comparison results.

9. An apparatus according to claim 3, further comprising:
   second latch means for latching the comparison result.

10. An apparatus according to claim 3, wherein said latching means includes:
    means for generating a first latch signal a predetermined time after reception of the detection signal and thereafter generating a second latch signal;
    first latch means for latching the comparison result in response to the first latch signal and latching the next comparison result in response to the second latch signal; and
    second latch means for latching the comparison result transferred from the first latch means, in response to the second latch signal.

11. An apparatus according to claim 3, wherein said determining means includes means for comparing the first and second comparison results with each other and for controlling the driving current when coincidence is detected between the first and second comparison results.

12. An apparatus according to claim 3, wherein said energizing means includes means for varying the intensity of the light beam in accordance with the comparison result cyclically and stepwise.

13. An apparatus according to claim 3, wherein said second driving means includes means for changing the warming-up mode to the printing mode in response to the beam detection signal and for increasing the drive current at a first cycle in the warming-up mode and at a second cycle in the printing mode.

* * * * *